(12) United States Patent
Ivanov et al.

(10) Patent No.: US 10,218,324 B2
(45) Date of Patent: Feb. 26, 2019

(54) DIFFERENTIAL INPUT STAGE WITH WIDE INPUT SIGNAL RANGE AND STABLE TRANSCONDUCTANCE

(71) Applicant: TEXAS INSTRUMENTS INCORPORATED, Dallas, TX (US)

(72) Inventors: Vadim Valerievich Ivanov, Tucson, AZ (US); Srinivas K. Pulijala, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/395,073

(22) Filed: Dec. 30, 2016

(65) Prior Publication Data

US 2018/0191319 A1 Jul. 5, 2018

(51) Int. Cl.
*H03F 3/45* (2006.01)
(52) U.S. Cl.
CPC ........... *H03F 3/45475* (2013.01); *H03F 3/45* (2013.01); *H03F 3/45071* (2013.01); *H03F 3/45174* (2013.01); *H03F 3/45183* (2013.01); *H03F 2200/462* (2013.01); *H03F 2203/45288* (2013.01); *H03F 2203/45528* (2013.01)
(58) Field of Classification Search
CPC .... H03F 3/45; H03F 3/45475; H03F 3/45174; H03F 3/45273; H03F 3/45372; H03F 3/4547; H03F 2203/45054; H03F 2203/45096; H03F 2203/45124; H03F 3/45071; H03F 3/45183; H03F 3/45085; H03F 3/45179
USPC .......................................... 330/253, 257, 300
See application file for complete search history.

(56) References Cited

U.S. PATENT DOCUMENTS

| 5,872,446 A * | 2/1999 | Cranford, Jr. ........ H03D 7/1441 330/288 |
| 7,310,017 B2 * | 12/2007 | Etou ..................... H03F 3/3022 330/253 |
| 2006/0170497 A1 * | 8/2006 | Maruyama .......... H03F 3/45188 330/254 |
| 2017/0117863 A1 * | 4/2017 | Tanaka ................ H03F 3/45174 |

* cited by examiner

*Primary Examiner* — Khanh V Nguyen
(74) *Attorney, Agent, or Firm* — John R. Pessetto; Charles A. Brill; Frank D. Cimino

(57) ABSTRACT

At least some embodiments are directed to a system that comprises a differential input transistor pair (DITP) comprising first and second transistors, a first feedback loop coupled to the first transistor, and a second feedback loop coupled to the second transistor. When a differential voltage applied to the input stage is within a first range, the first and second feedback loops control a tail current supplied to the DITP, where the tail current at least partially determines a transconductance of the DITP. When the differential voltage is within a second range, the transconductance of the DITP is at least partially determined by a first resistor in the first feedback loop or by a second resistor in the second feedback loop.

20 Claims, 3 Drawing Sheets

DIFFERENTIAL INPUT STAGE WITH WIDE INPUT SIGNAL RANGE AND STABLE TRANSCONDUCTANCE

BACKGROUND

Differential input stages are used in various types of analog integrated circuits and for various applications. Such input stages may, for instance, be used to form operational amplifiers. Differential input stages typically include a tail current source that supplies current to multiple transistors. The flow of current through the transistors is controlled by input voltages that are applied to the transistors. The differential input stage may thus be characterized by a transconductance—that is, the response of the current output by the differential input stage as a function of the input voltages provided to the differential input stage. Many differential input stages provide stable transconductance when the input voltages are within a narrow, defined range.

SUMMARY

At least some embodiments are directed to a system that comprises a differential input transistor pair (DITP) comprising first and second transistors, a first feedback loop coupled to the first transistor, and a second feedback loop coupled to the second transistor. When a differential voltage applied to the input stage is within a first range, the first and second feedback loops control a tail current supplied to the DITP, where the tail current at least partially determines a transconductance of the DITP. When the differential voltage is within a second range, the transconductance of the DITP is at least partially determined by a first resistor in the first feedback loop or by a second resistor in the second feedback loop. Some such embodiments may be supplemented using one or more of the following concepts, in any order and in any combination: wherein at least one of the first and second resistors has a resistance that is an inverse of the transconductance of the DITP when the differential voltage is within the first range; wherein the first feedback loop comprises the first resistor and multiple transistors; wherein a sizing ratio of the multiple transistors determines a minimum current flowing through the first transistor in the DITP; wherein, when in the first range, the differential voltage is zero; wherein, when in the second range, the differential voltage exceeds 150 milliVolts; wherein the system comprises an operational amplifier; wherein the tail current flows through a tail current transistor coupled to the first and second transistors, the tail current transistor mirrors a current flowing through another transistor common to both the first and second feedback loops; wherein the first and second transistors of the DITP couple to third and fourth transistors, the third transistor couples to a fifth transistor that couples to the first feedback loop, and the fourth transistors couples to a sixth transistor that couples to the second feedback loop; wherein the first and second transistors are p-type metal oxide semiconductor field effect transistors (MOSFETs), wherein the first feedback loop comprises an n-type MOSFET, wherein the second feedback loop comprises another n-type MOSFET, and wherein the first and second feedback loops share a common p-type MOSFET that is distinct from the first and second transistors.

In at least some embodiments, a system comprises a differential input transistor pair (DITP) comprising first and second transistors and a first feedback loop comprising a first resistor and third, fourth, and fifth transistors. The third transistor couples to the first transistor. The system also comprises a second feedback loop comprising a second resistor, sixth and seventh transistors, and the fifth transistor, with the sixth transistor coupled to the second transistor. The system also comprises a tail current transistor coupled to the first and second transistors, with the tail current transistor configured to mirror a current flowing through the fifth transistor. One or more such embodiments may be supplemented using one or more of the following concepts, in any order and in any combination: wherein the first, second, third, and sixth transistors comprise metal oxide semiconductor field effect transistors (MOSFETs); wherein the fourth, fifth, seventh, and tail current transistors comprise bipolar junction transistors (BJTs); wherein the first and second resistors have resistances such that the transconductance of the DITP when a differential input voltage is in a first range is within 10% of the transconductance of the DITP when the differential input voltage is zero; wherein, when a differential input voltage applied to the DITP is zero or within a predetermined range of zero, a tail current in the tail current transistor is determined based on a ratio of at least some of the transistors in the first feedback loop, based on another ratio of at least some of the transistors in the second feedback loop, or a combination of the ratio and the another ratio; further comprising a constant current source coupled to a base of the fifth transistor; further comprising an eighth transistor coupled to the fourth transistor, and a ninth transistor coupled to the eighth transistor, a base of the eighth transistor coupled to a collector of the eighth transistor, and a base of the ninth transistor coupled to a collector of the ninth transistor; further comprising: an eighth transistor coupled to the first transistor; a ninth transistor coupled to the second transistor; a tenth transistor coupled to the eighth transistor and to the first feedback loop; and an eleventh transistor coupled to the ninth transistor and to the second feedback loop.

In at least some embodiments, a method comprises receiving a differential input voltage at a differential input transistor pair (DITP) of an analog integrated circuit (IC), with a tail current transistor supplying a tail current to the DITP. The method also comprises, in response to the differential input voltage being in a first range, controlling a first minimum current in a first feedback loop based on a first sizing ratio of multiple transistors in the first feedback loop and controlling a second minimum current in a second feedback loop based on a second sizing ratio of additional transistors in the second feedback loop. The first and second minimum currents together compose the tail current. The tail current determines a transconductance of the DITP. The method further comprises, in response to the differential input voltage being in a second range, providing an output current from the DITP based on a resistor having a resistance determined based on the transconductance of the DITP when the differential input voltage is in the first range. Some such embodiments may be supplemented using the following concept: wherein the resistance is an inverse of the transconductance of the DITP when the differential input voltage is in the first range.

BRIEF DESCRIPTION OF THE DRAWINGS

For a detailed description of various examples, reference will now be made to the accompanying drawings in which.

DETAILED DESCRIPTION

At least some of the embodiments disclosed herein are directed to a differential input stage having a transconductance that is more stable across a wide range of input voltages relative to differential input stages that do not implement the disclosed techniques. More specifically, the differential input stage is designed to maintain a constant or near-constant transconductance when the differential input voltage applied to the input stage varies across a wide range of values.

The differential input stage may include a differential input transistor pair (DITP) to which the input voltages are applied. The input stage may further comprise multiple feedback loops, with each feedback loop coupled to one of the transistors in the DITP. Each of the feedback loops may contain multiple transistors, and a sizing ratio of the transistors in a feedback loop may determine a minimum current that may flow through that feedback loop. The currents flowing through the feedback loops determine a tail current provided by a tail current source to the DITP. When the differential input voltage is in a first range (e.g., 0 V or within a predetermined range of 0 V), the currents flowing through the feedback loops may determine the tail current and, thus, the transconductance provided by the DITP. When the differential input voltage is in a second range (e.g., 150 mV or more), the transconductance may be determined primarily by the resistances of one or more resistors in the feedback loops. Accordingly, the resistance values of such resistors may be chosen during the design stage so that the transconductance is the same or substantially the same (e.g., one value is within 10% of the other) regardless of the differential input voltage applied to the DITP.

Figure 1:
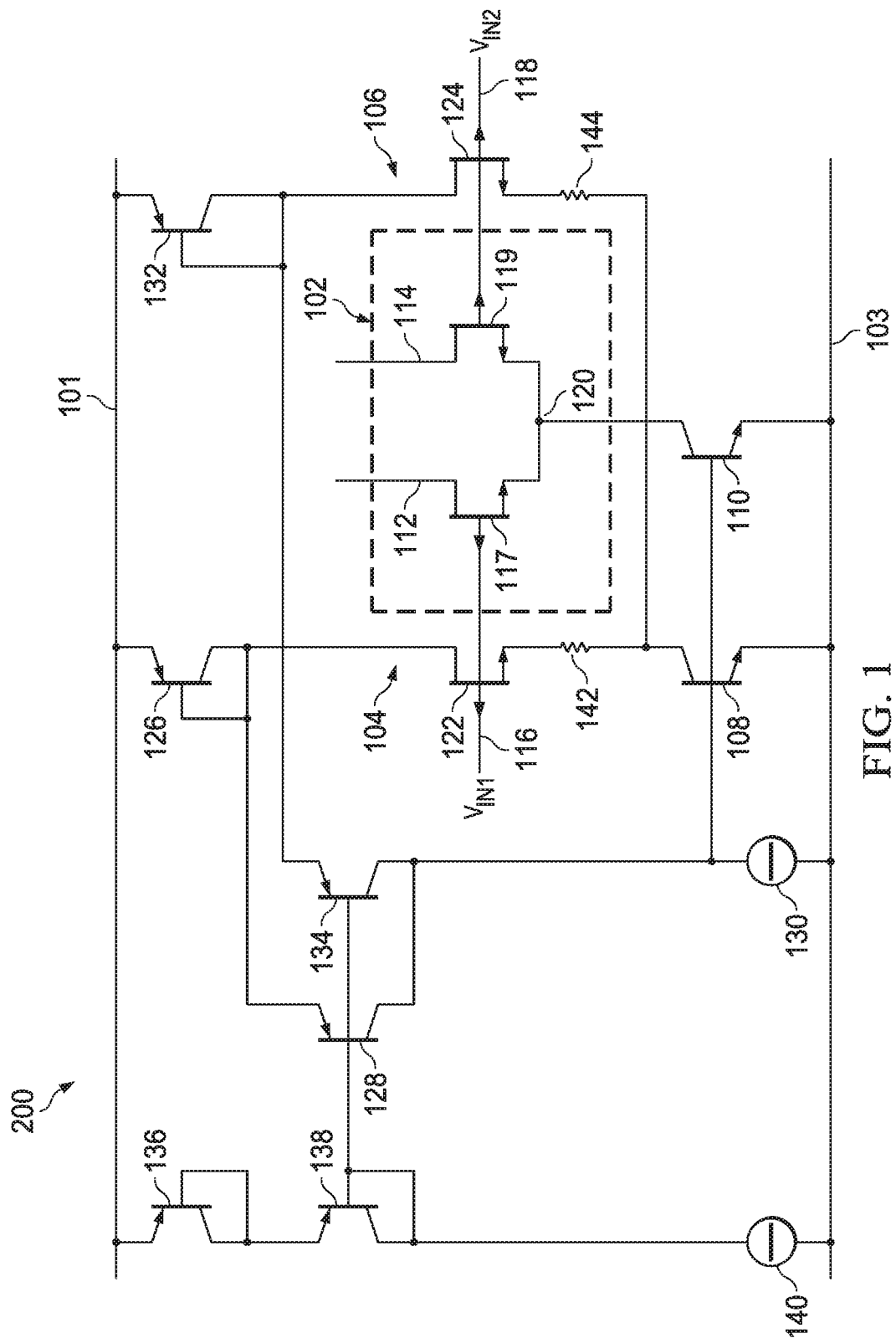
FIG. 1 is a circuit schematic diagram of an illustrative differential input stage.

FIG. 1 is a circuit schematic diagram of an illustrative differential input stage 200. The differential input stage 200 depicted in FIG. 1, as is the case with other differential input stage embodiments disclosed herein, may be implemented in any suitable analog IC application (e.g., operational amplifier) that requires a current output that is determined as a function of a voltage input. More particularly, the input stage 200 may be implemented in any analog IC application requiring a stable transconductance across a wide range of input voltage values. The differential input stage 200 may comprise a DITP 102, which may include transistors 117 and 119 (e.g., n-type metal oxide semiconductor field effect transistors (MOSFETs), other types of MOSFETs or bipolar junction transistors (BJTs)) coupled to each other via a node 120. In some embodiments, the node 120 couples to the sources of the transistors 117 and 119. The transistors 117 and 119 also couple to current outputs 112 and 114, respectively. In some embodiments, the current outputs 112, 114 couple to the drains of the transistors 117, 119. The differential input stage 200 may include two feedback loops 104, 106. More or fewer feedback loops may be included as desired and as may be appropriate.

The feedback loop 104 may comprise one or more of the following: a transistor 122 (e.g., a transistor identical to the transistor 117); a transistor 126 (e.g., a bipolar junction transistor (BJT)) which, in some embodiments, may be substituted with a resistor; a transistor 128 (e.g., a BJT), a constant bias current source 130 supplying current at any suitable level to achieve the differential input stage operation described herein; a transistor 108 (e.g., a BJT); and a resistor 142 having a resistance that is the inverse of a target transconductance, as described in greater detail below. Although the specific configuration of the various components of the feedback loop 104 may vary between embodiments, in at least some embodiments, the collector and the base of the transistor 126 are tied together and are coupled to the drain of the transistor 122. In some embodiments, the collector and the base of the transistor 126 couple to an emitter of the transistor 128. In some embodiments, the collector of the transistor 128 couples to the current source 130, and, in some embodiments, the current source 130 couples to the base and emitter of the transistor 108. The collector of the transistor 108 may couple to the resistor 142, which, in turn, may couple to the source of the transistor 122. In some embodiments, the gates of the transistors 122, 117 are tied together and receive an input voltage 116 ($V_{IN1}$). In some embodiments, the emitter of the transistor 126 couples to a positive supply rail 101, and a negative supply rail 103 couples to the emitter of the transistor 108 and to the current source 130. In some embodiments, the base of the transistor 108 couples between the current source 130 and the collectors of the transistors 134, 128.

The feedback loop 106 may include one or more of the following: a transistor 124 (e.g., an n-type MOSFET identical to the transistor 119); a transistor 132 (e.g., a BJT) which, in some embodiments, may be substituted with a resistor; a transistor 134 (e.g., a BJT); the current source 130; the transistor 108; and a resistor 144 having a resistance determined based on the inverse of a target transconductance, as described below. The precise configuration of the components in the feedback loop 106 may vary. In at least some embodiments, however, the drain of the transistor 124 couples to the collector of the transistor 132, which, in turn, may be tied to the base of the transistor 132. The base and collector of the transistor 132 may couple to the emitter of the transistor 134. In some embodiments, the collectors of the transistors 128, 134 are tied together. The collector of the transistor 134 may couple to the current source 130, which, as explained above, may couple to the base and emitter of the transistor 108. The collector of the transistor 108 may couple to the resistor 144, and the resistor 144 may couple to the source of the transistor 124. The gates of the transistors 119, 124 may be tied together and may receive an input voltage 118 ($V_{IN2}$). In some embodiments, the emitter of the transistor 132 couples to the positive supply rail.

The differential input stage 200 may further comprise a transistor 110 (e.g., a BJT), which provides a tail current to the DITP 102 via node 120. Accordingly, the transistor 110 may be termed the "tail current source" 110 or the "tail current transistor" 110. In some embodiments, the base of the transistor 110 ties to the base of the transistor 108. In some embodiments, the base of the transistor 110 couples between the current source 130 and the collectors of the transistors 134, 128. In some embodiments, the emitter of the transistor 110 couples to the negative supply rail 103.

In addition, the differential input stage 200 may include a transistor 136 (e.g., a BJT), which, in some embodiments, may be substituted by a resistor; a transistor 138 coupled to the transistor 136; and a constant bias current source 140 coupled to the transistor 138. In some embodiments, the emitter of the transistor 136 couples to the positive supply rail 101. The base and collector of the transistor 136 may be tied together. In some embodiments, the emitter of the transistor 138 couples to the collector of the transistor 136. The base and collector of the transistor 138 may be tied together. In some embodiments, the collector of the transistor 138 couples to the current source 140.

The operation of the differential input stage 200 may be described in terms of the input stage response to various differential input voltages at 116, 118. When the input voltages 116, 118 are such that the difference between them is in a first range (e.g., at 0 V or within a predetermined range of 0 V, such as +/−50 mV), the transistors 117, 119 are on, and the transistors 122, 124 also are on. The feedback loop 104 carries a current, with the minimum current through the feedback loop 104 determined based on the sizing ratio of the transistors 126 and 136, as well as the current source 130. For example, assuming that the sizes of transistors 128, 134, and 138 are identical, that the currents provided by sources 130 and 140 are identical, and that the sizes of transistors 126 and 132 are identical, the minimum current flowing through the feedback loop 104 may be the current provided by source 130 multiplied by the sizing ratio of transistor 126 to transistor 136. In at least some embodiments, when the differential input voltage is in the first range, the feedback loop 104 maintains the current in the loop at the minimum current level. In some embodiments, when the differential input voltage is in the first range, the feedback loop 104 may maintain the current in the loop at a level greater than the minimum current level. The feedback loop 106 behaves similarly to the feedback loop 104. Specifically, the feedback loop 106 carries a current, with the minimum current through the feedback loop 106 determined based on the sizing ratio of the transistors 132 and 136, as well as the current source 130. In at least some embodiments, when the differential input voltage is in the first range, the feedback loops 104 and 106 maintain the currents in the loop at the minimum current levels. In some embodiments, when the differential input voltage is in the first range, the feedback loop 106 may maintain the current in the loop at a level greater than the minimum level.

The currents flowing through the feedback loops 104, 106—which, as explained, may be the minimum currents that can flow through the loops—together form the total current flowing through the transistor 108, since the transistor 108 is common to both loops 104, 106. The bases of the transistors 108, 110 are tied together, and the emitters of the transistors 108, 110 are tied together, thus causing the transistor 110 to mirror the current flowing through the transistor 108. The current through the transistor 110 flows to the current outputs 112, 114 via the node 120 and transistors 117, 119. The current flowing through transistor 110 defines the transconductance of the DITP 102, since the differential input voltage is 0 V (or within a small, predetermined range of 0 V, such as and without limitation, +/−50 mV).

When the differential input voltage applied to the DITP 102 is in a second range (e.g., greater than 150 mV and less than 2 V), the differential input stage 200 behaves differently than when the differential input voltage is in the first range, and the transconductance of the stage 200 is determined differently as well. In particular, one of the transistors 117, 119 is shut off, depending on which of the input voltages 116, 118 is higher. For instance, if the input voltage 116 is 0 V and the input voltage 118 is 1 V, the voltage across resistor 144 is slightly higher than 1 V (due to the voltage drop across the transistor 124) and the voltage between the gates of the transistors 117, 124 is approximately 1 V. Accordingly, the transistor 117 is shut off. Although the transistor 117 is off, the transistor 122 may still be on and the feedback loop 104 may maintain its minimum current via transistor 128 as determined by the aforementioned transistor ratios. The current flowing through the transistor 124 may be substantially greater than the aforementioned minimum current due to the increased differential input voltage. As a result, the transistor 134 may shut off, and the current in feedback loop 106 may not contribute to the tail current passing through the transistor 110. For these reasons and the reasons described above, the transistors 128, 134, and 138 determine which currents in the feedback loops do and do not contribute to the tail current flowing through the transistor 110. The currents in the feedback loops 104, 106 combine to flow through the transistor 108, which is mirrored by the transistor 110. Because the transistor 117 may be off, the tail current provided by the transistor 110 flows through the transistor 119 and out the current output 114. The transconductance of the DITP 102 may be expressed as:

$$gm0 = \frac{I1 - I0}{\Delta V_{IN}} \quad (1)$$

where gm0 is the transconductance, I1 is the current flowing through transistor 119, I0 is the current flowing through transistor 117, and $\Delta V_{IN}$ is the differential input voltage at voltage inputs 116, 118. Because no current flows through transistor 117 (which is off), and because $$\Delta V_{IN} = RI1 \quad (2)$$

where R is the resistance of either of the resistors 142, 144 (which may be identical), the transconductance in expression (1) may be re-written as follows:

$$gm0 = \frac{1}{R} \quad (3)$$

Because the transconductance of the DITP 102 when the differential input voltage is in the first range is known when designing the differential input stage 200, the value of R—that is, the identical resistances of the resistors 142, 144—may be selected to achieve the same transconductance when the differential input voltage is in the second range. As a result, the transconductance remains approximately stable (i.e., constant or at least within 10% of a baseline value) for various differential input voltages.

Figure 2:
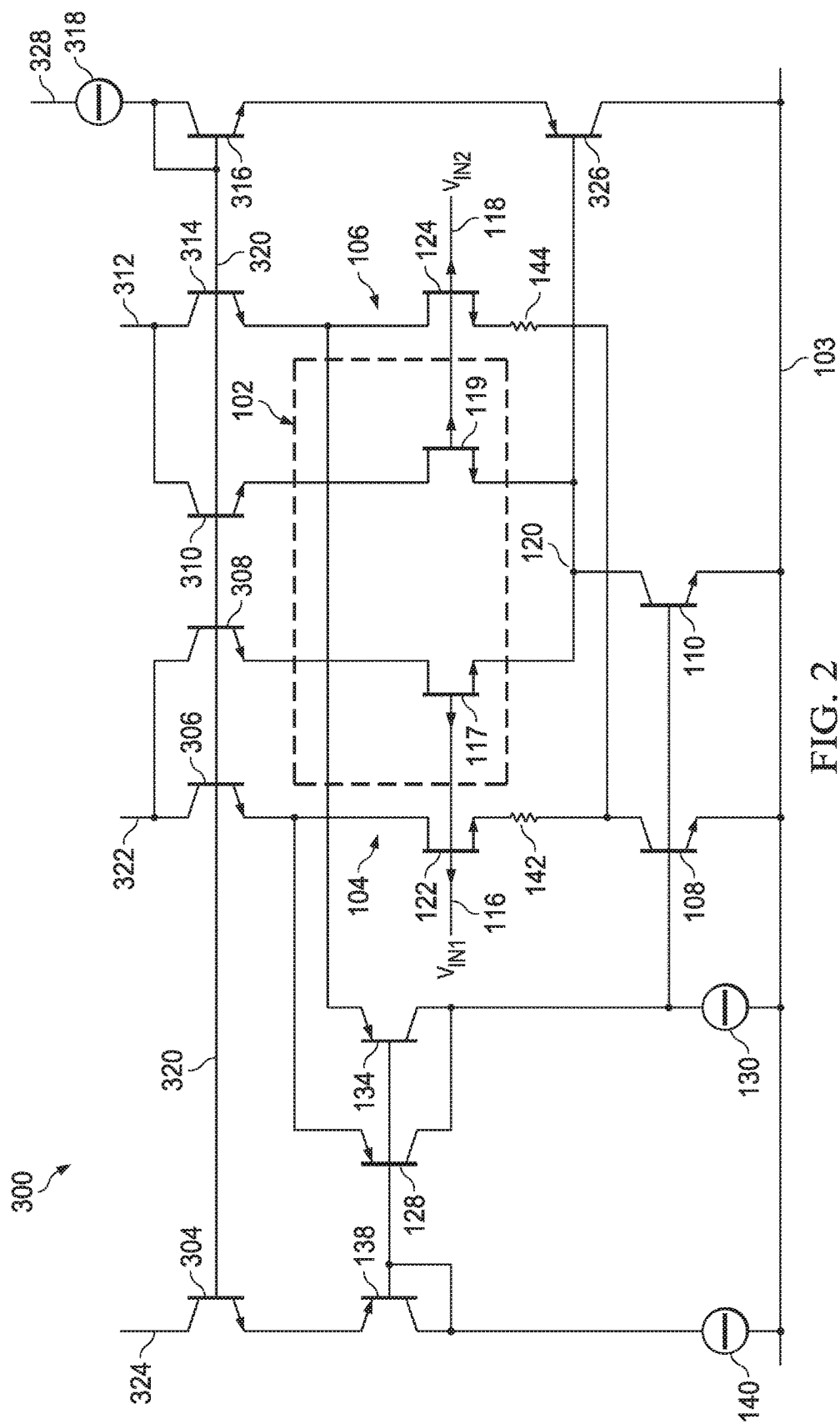
FIG. 2 is a circuit schematic diagram of another illustrative differential input stage.

FIG. 2 is a circuit schematic diagram of another illustrative differential input stage 300. The differential input stages 200 and 300 share similar architectures. Accordingly, only the differences in the architectures are now described. Referring simultaneously to FIGS. 1 and 2, the differential input stage 300 may lack the transistors 136, 126, and 132 that are present in the differential input stage 200. Instead, the differential input stage 300 may comprise transistors 304, 306, 308, 310, 314, and 316 (all of which may be, e.g., BJTs, although other types of components, such as MOSFETs, are contemplated). The bases of each of the transistors 304, 306, 308, 310, 314, and 316 may be tied together via a connection 320, and they all may also couple to a constant bias current source 318. The collector 324 of the transistor 304 may couple to a positive supply rail (not expressly shown in FIG. 2). The collectors of the transistors 306, 308 may be tied together and may couple to a current output 322. Similarly, the collectors of the transistors 310, 314 may be tied together and may couple to a current output 312. The connection 320 may be tied to the collector of the transistor 316. The connections 324 and 328 couple to a positive supply rail (not expressly shown in FIG. 2). The operation of the differential input stage 300 is similar to that of the differential input stage 200, with a few exceptions. The transistors 304, 306, 308, 310, 314, and 316 are controlled by the bias current source 318. By coupling the collectors of the transistors 306, 308, current that would otherwise be wasted through the feedback loop 104 is included as part of the output current on the current output 322. Similarly, by coupling the collectors of the transistors 310, 314, current that would otherwise be wasted through the feedback loop 106 is included as part of the output current on the current output 312. The DITP 102 is cascoded by transistors 308 and 310. The transistors 316 and 326 in combination with the current provided by current source 318 define the cascoding voltage at the bases of transistors 308 and 310 with respect to the sources of transistors 117 and 119.

The scope of disclosure is not limited to the specific architectures of the differential input stages 200 and 300 shown in FIGS. 1 and 2. For example and without limitation, at least some of various BJTs in the differential input stage 100 may be substituted with MOSFETs (e.g., p-type MOSFETs, n-type MOSFETs) or, in some instances, resistors. In some embodiments, for instance, one or more of the BJTs 134, 128, 138, 108, and 110 may be replaced by a p-type or n-type MOSFET, with BJT base connections being replaced by MOSFET gate connections, BJT emitter connections being replaced by MOSFET source (or drain) connections, and BJT collector connections being replaced by MOSFET drain (or source) connections. In addition, in some embodiments, one or more of the BJTs 136, 126, and 132 may be replaced by resistors, n-type MOSFETS, or p-type MOSFETs. In embodiments where MOSFETs are used to replace BJTs 136, 126, and 132, the gate of each MOSFET may be coupled to the source of that MOSFET. Similarly, in differential input stage 300, one or more of the BJTs 304, 306, 308, 310, 314, 316, 138, 128, 134, 108, 110, and 326 may be substituted with a different type of component, such as a MOSFET (e.g., p-type MOSFET, n-type MOSFET), or, in some instances, a resistor. In such embodiments, the BJTs base connections may be replaced with MOSFET gate connections, BJT collector connections may be replaced with MOSFET drain (or source) connections, and BJT emitter connections may be replaced with MOSFET source (or drain) connections. Other substitutions and connections are contemplated and fall within the scope of this disclosure.

Figure 3:
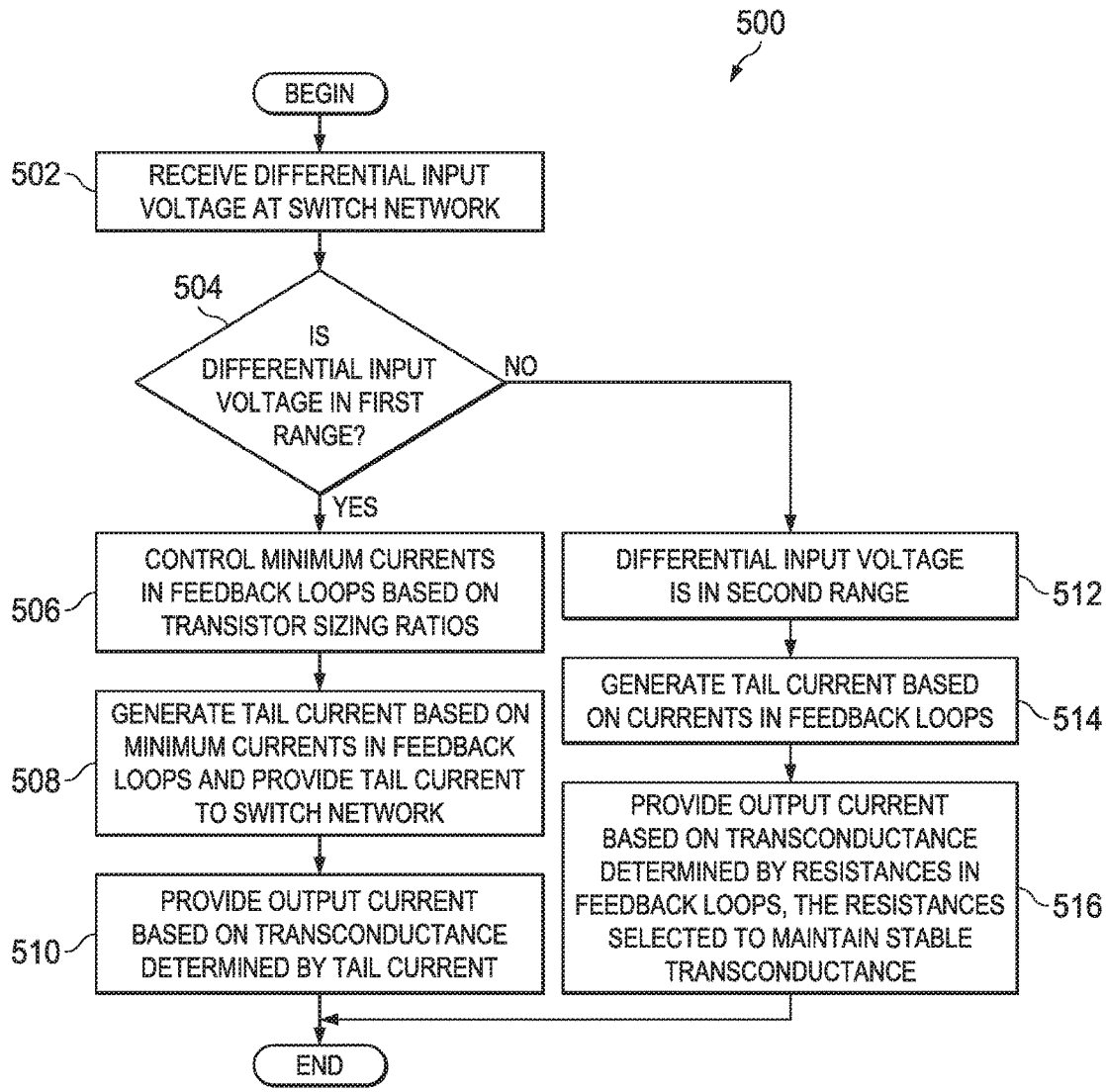
FIG. 3 is a flow diagram of an illustrative method in accordance with embodiments.

FIG. 3 is a flow diagram of an illustrative method 500 in accordance with embodiments. The method 500 may be implemented in any of the embodiments depicted in FIGS. 1-2. However, the scope of disclosure is not limited to application of the method 500 in those embodiments. Application of the method 500 in other embodiments encompassing the techniques disclosed herein is contemplated. The method 500 may include receiving a differential input voltage at a DITP (step 502). In general, such a DITP may include a pair of transistors to receive the input voltages and to control the flow of current to a pair of current outputs. Such a DITP may include, for example, the DITP 102 described above.

The method 500 next includes determining whether the differential input voltage is in a first range (step 504). As explained above, such a range may include 0 V and may span, e.g., from 0 V +/−50 mV. If the differential input voltage is in the first range, the method 500 may include controlling minimum currents flowing through the feedback loops in the differential input stage based on sizing ratios of transistors in those feedback loops (step 506). Stated in another manner, when the differential input voltage is in the first range, the minimum currents that may flow through the feedback loops are determined by the sizing ratios of transistors in those feedback loops, as described above.

The method 500 may next include generating a tail current based on the minimum currents in the feedback loops and providing the tail current to the DITP (step 508). Such a tail current may be generated by, for instance, a tail current source (e.g., a transistor) that mirrors total current flow through the feedback loops. The method 500 may additionally include providing an output current(s) based on the transconductance, which depends on the tail current (step 510). Tail currents may be output on multiple current outputs in the DITP—for instance, the current outputs 112, 114 in FIG. 1 and the current outputs 312, 322 in FIG. 2.

If the differential input voltage is not in the first range (step 504), it may be concluded that the differential input voltage is in a second range (step 512). Accordingly, the method 500 may include generating a tail current based on the currents in the feedback loop (step 514). The currents in the feedback loop may be minimum currents, increased currents (due to the increase in differential input voltage), or both. The method 500 may further include providing an output current based on the transconductance of the DITP, with the transconductance being determined by resistances in the feedback loops (step 516). The resistances may be selected as desired during a design phase to maintain a transconductance that is the same as or within a predetermined variance of the transconductance that is produced when the differential input voltage is in the first range, as explained above. The method 500 may be modified as desired, including by adding, deleting, modifying, or rearranging one or more steps.

The above discussion is meant to be illustrative. Numerous variations and modifications will become apparent to those skilled in the art once the above disclosure is fully appreciated. It is intended that the following claims be interpreted to embrace all such variations and modifications.

What is claimed is:

1. A system, comprising:
 a differential input transistor pair (DITP) comprising first and second transistors;
 a first feedback loop coupled to the first transistor; and
 a second feedback loop coupled to the second transistor,
 wherein, when a differential voltage applied to the differential input transistor pair is within a first range, the first and second feedback loops control a tail current supplied to the DITP, the tail current at least partially determines a transconductance of the DITP,
 wherein, when the differential voltage is within a second range, the transconductance of the DITP is at least partially determined by a first resistor in the first feedback loop or by a second resistor in the second feedback loop.

2. The system of claim 1, wherein at least one of the first and second resistors has a resistance that is an inverse of the transconductance of the DITP when the differential voltage is within the first range.

3. The system of claim 1, wherein the first feedback loop further comprises multiple transistors.

4. The system of claim 3, wherein a sizing ratio of the multiple transistors determines a minimum current flowing through the first transistor in the DITP.

5. The system of claim 1, wherein, when in the first range, the differential voltage is zero.

6. The system of claim 1, wherein, when in the second range, the differential voltage exceeds 150 milliVolts.

7. The system of claim 1, wherein the system comprises an operational amplifier.

8. The system of claim 1, wherein the tail current flows through a tail current transistor coupled to the first and second transistors, the tail current transistor mirrors a current flowing through another transistor common to both the first and second feedback loop.

9. The system of claim 1, wherein the first and second transistors of the DITP couple to third and fourth transistors, the third transistor couples to a fifth transistor that couples to the first feedback loop, and the fourth transistors couples to a sixth transistor that couples to the second feedback loop.

10. The system of claim 1 wherein the first and second transistors are p-type metal oxide semiconductor field effect transistors (MOSFETs), wherein the first feedback loop comprises an n-type MOSFET, wherein the second feedback loop comprises another n-type MOSFET, and wherein the first and second feedback loops share a common p-type MOSFET that is distinct from the first and second transistors.

11. A system, comprising:
a differential input transistor pair (DITP) comprising first and second transistors;
a first feedback loop comprising a first resistor and third, fourth, and fifth transistors, the third transistor coupled to the first transistor;
a second feedback loop comprising a second resistor, sixth and seventh transistors, and the fifth transistor, the sixth transistor coupled to the second transistor; and
a tail current transistor coupled to the first and second transistors, the tail current transistor configured to mirror a current flowing through the fifth transistor.

12. The system of claim 11, wherein the first, second, third, and sixth transistors comprise metal oxide semiconductor field effect transistors (MOSFETs).

13. The system of claim 11, wherein the fourth, fifth, seventh, and tail current transistors comprise bipolar junction transistors (BJTs).

14. The system of claim 11, wherein the first and second resistors have resistances such that the transconductance of the DITP when a differential input voltage is in a first range is within 10% of the transconductance of the DITP when the differential input voltage is zero.

15. The system of claim 11, wherein, when a differential input voltage applied to the DITP is zero or within a predetermined range of zero, a tail current in the tail current transistor is determined based on a ratio of at least some of the transistors in the first feedback loop, based on another ratio of at least some of the transistors in the second feedback loop, or a combination of the ratio and the another ratio.

16. The system of claim 11, further comprising a constant current source coupled to a base of the fifth transistor.

17. The system of claim 11, further comprising an eighth transistor coupled to the fourth transistor, and a ninth transistor coupled to the eighth transistor, a base of the eighth transistor coupled to a collector of the eighth transistor, and a base of the ninth transistor coupled to a collector of the ninth transistor.

18. The system of claim 11, further comprising:
an eighth transistor coupled to the first transistor;
a ninth transistor coupled to the second transistor;
a tenth transistor coupled to the eighth transistor and to the first feedback loop; and
an eleventh transistor coupled to the ninth transistor and to the second feedback loop.

19. A method, comprising:
receiving a differential input voltage at a differential input transistor pair (DITP) of an analog integrated circuit (IC), a tail current transistor supplying a tail current to the DITP;
in response to the differential input voltage being in a first range, controlling a first minimum current in a first feedback loop based on a first sizing ratio of multiple transistors in the first feedback loop and controlling a second minimum current in a second feedback loop based on a second sizing ratio of additional transistors in the second feedback loop, the first and second minimum currents together compose the tail current, the tail current determines a transconductance of the DITP; and
in response to the differential input voltage being in a second range, providing an output current from the DITP based on a resistor having a resistance determined based on the transconductance of the DITP when the differential input voltage is in the first range.

20. The method of claim 19, wherein the resistance is an inverse of the transconductance of the DITP when the differential input voltage is in the first range.

* * * * *